(12) United States Patent
Jiang et al.

(10) Patent No.: US 8,846,535 B2
(45) Date of Patent: Sep. 30, 2014

(54) METHOD OF FABRICATING A SEMICONDUCTOR DEVICE

(75) Inventors: Li Jiang, Beijing (CN); Mingqi Li, Beijing (CN); Pulei Zhu, Beijing (CN)

(73) Assignee: Semiconductor Manufacturing International (Beijing) Corporation, Beijing (CN)

( * ) Notice: Subject to any disclaimer, the term of this patent is extended or adjusted under 35 U.S.C. 154(b) by 85 days.

(21) Appl. No.: 13/315,143

(22) Filed: Dec. 8, 2011

(65) Prior Publication Data

US 2012/0315762 A1 Dec. 13, 2012

(30) Foreign Application Priority Data

Jun. 9, 2011 (CN) .......................... 2011 1 0152847

(51) Int. Cl.
| | |
|---|---|
| *H01L 21/302* | (2006.01) |
| *H01L 21/461* | (2006.01) |
| *H01L 21/02* | (2006.01) |
| *H01L 29/49* | (2006.01) |
| *H01L 21/321* | (2006.01) |
| *H01L 21/28* | (2006.01) |

(52) U.S. Cl.
CPC ........ *H01L 29/495* (2013.01); *H01L 21/02244* (2013.01); *H01L 21/3212* (2013.01); *H01L 21/28079* (2013.01); *H01L 21/02074* (2013.01)
USPC ......................................................... 438/692

(58) Field of Classification Search
CPC ................... H01L 21/02074; H01L 21/02244; H01L 21/28079; H01L 21/3212; H01L 21/04
USPC ..................... 117/87; 134/1.3, 29, 3; 216/83; 252/79.1; 257/295, 410, 411, 77, 797; 438/16, 183, 197, 213, 585, 677, 692, 438/693; 451/41, 540, 56, 8; 510/175; 73/862.331
See application file for complete search history.

(56) References Cited

U.S. PATENT DOCUMENTS

| | | | |
|---|---|---|---|
| 2001/0023127 A1* | 9/2001 | Andreas | 438/623 |
| 2004/0043611 A1* | 3/2004 | Stoeckgen et al. | 438/687 |
| 2007/0152252 A1* | 7/2007 | Buehler et al. | 257/295 |

FOREIGN PATENT DOCUMENTS

CN 1733856 2/2006

OTHER PUBLICATIONS

Office Action from corresponding Chinese Patent Appl. No. 2011-10152847.8, dated Jun. 3, 2014.

* cited by examiner

*Primary Examiner* — Duy Deo
*Assistant Examiner* — Erin Bergner
(74) *Attorney, Agent, or Firm* — Koppel, Patrick, Heybl & Philpott; Michael J. Ram

(57) ABSTRACT

The present invention discloses a method for fabricating semiconductor devices. After removing excessive aluminum to form aluminum gates through a chemical mechanical planarization (CMP) process, the exposed surfaces of the aluminum gates are oxidized with $H_2O_2$ solution to form a film of alumina, and the semiconductor device is cleaned.

11 Claims, 7 Drawing Sheets

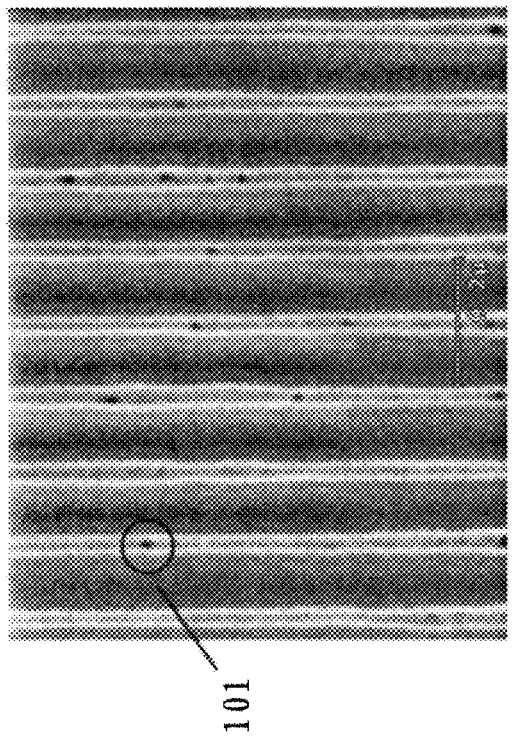
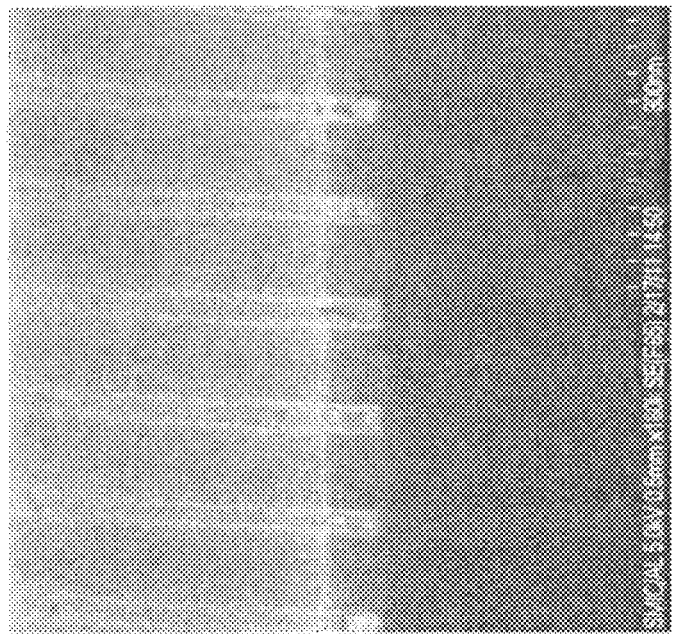
FIG. 1A PRIOR ART
FIG. 1B PRIOR ART

METHOD OF FABRICATING A SEMICONDUCTOR DEVICE

CROSS-REFERENCE TO RELATED APPLICATIONS

This application claims priority to Chinese Patent Application No. 201110152847.8, filed on Jun. 9, 2011 and entitled "Method of Fabricating A Semiconductor Device", which is incorporated herein in its entirety by reference.

BACKGROUND OF THE INVENTION

1. Field of the Invention

The present invention relates to a method of fabricating semiconductor devices, and more particularly, to a method of fabricating semiconductor devices having aluminium gates.

2. Description of the Related Art

With the continuous development of semiconductor fabrication techniques, the size of a semiconductor device is continuously shrinking. The high-k metal gate gradually becomes the mainstream of the development of current semiconductor techniques, and an aluminium gate is favoured for its excellent characteristics.

At present, in a typical gate-last fabrication process, since a high-k insulating material will be subjected to a series of standard processes, including metallic silicides and silicon nitride stress engineering (double-stress layer), depositions are implemented prior to gate formation, then gaps between those gates are filled with oxides, and a chemical mechanical planarization (CMP) process is resorted to for removing excessive oxides on the surfaces of the gates. Next, gate materials for NMOS and PMOS are removed with a single process, and metal gate materials are deposited thereafter. In practice, it is required for metal gate depositions to fully cover the steps with zero damage of high-k materials. Finally, a chemical mechanical planarization technique is adopted to remove excessive metals. In order to guarantee product quality, the whole procedure is continuously monitored and cleaning processes are implemented as appropriate. When the above operations are accomplished, an insulating medium is deposited on the wafer and contact holes are formed via etching.

In the above processes, after removing excessive metals through the CMP technique, deionized water is commonly used to clean the wafer surface which has just been grinded, so as to remove retained abrasive materials. Since aluminium has a relative higher activity, when deionized water comes into contact with the surface of Al gates, it can capture electrons from Al gates and turn into $H_2$. Thus, corrosion occurs on the surfaces of Al gates (mainly in terms of pits). If the Al gates contain impurities therein, such corrosion can be fairly serious.

FIGS. 1A-1D show scanning electric microscopy photos of the surfaces of Al gates after cleaning with deionized water. It can be seen from FIGS. 1A-1D, that pits 101 primarily occur on grain boundaries in aluminium (because impurities and defects mainly exist on those grain boundaries). It also can be seen from the FIGS. 1A-1D, that the number of the pits is very large, approximately up to hundreds or thousands. During the device fabrication, if these pits occur at gate areas, the performance of the semiconductor device can be greatly degraded and the reliability of the semiconductor device may be negatively influenced.

Therefore, a new technique is required to resolve any problem identified in prior art.

SUMMARY OF THE INVENTION

An object of the present invention is to provide a method of fabricating a semiconductor device with the aim of resolving at least one issue in prior art.

According to a first aspect of the present invention, a method of fabricating a semiconductor device is provided, which may comprise: a step of providing a substrate with aluminium (Al) deposited thereon; a step of chemical mechanical planarization (CMP), for carrying out CMP on the substrate on which aluminium (Al) is deposited, so as to form a plurality of Al gates and expose a surface of each Al gate; a step of oxidation, for carrying out an oxidation process on the surface of each CMP processed Al gate with $H_2O_2$ solution, so as to form a thin film of alumina on the surface of each Al gate; and a step of cleaning the substrate.

Preferably, the step of cleaning comprises cleaning the substrate with the $H_2O_2$ solution.

Preferably, the step of CMP, the step of oxidation and the step of cleaning are carried out in a chemical mechanical planarization device, which comprises a grinding head for locating a semiconductor device, the down force of the grinding head being less than 0.8 psi during the step of oxidation and the step of cleaning.

Preferably, the step of oxidation is carried out in the chemical mechanical planarization device, which comprises a rotating plate provided with a polishing pad, the rotating speed of the rotating plate is from 50 rpm to 110 rpm during the step of oxidation and the step of cleaning.

Preferably, the process time of the step of oxidation is less than 10 s.

Furthermore, when the process time of the step of oxidation is less than or equal to 10 s, the mass concentration of the $H_2O_2$ solution is preferably larger than or equal to 15%.

Preferably, when the surface of substrate is cleaned in the step of first cleaning, the sum of process time of the step of oxidation and the process time of the step of first cleaning is 10 s-50 s.

Preferably, if the step of first cleaning is to be performed further, the mass concentration of the $H_2O_2$ solution adopted in the step of oxidation and the step of first cleaning is preferably larger than or equal to 4%.

The present invention has at least one of the following advantages: a compact thin film of alumina is formed on the surfaces of Al gates by performing the step of oxidation on a CMP processed surfaces of Al gates with $H_2O_2$ solution. The thin film of alumina can protect the surfaces of Al gates from being eroded by cleaning agent, such as deionized water, in subsequent cleaning processes, so that the corrosion as well as the pits on the surfaces of the gates can be significantly reduced. In addition, through controlling at least one parameter of mass concentration of $H_2O_2$ solution, down force of grinding head, and rotating speed of plate, the surface of the substrate can be cleaned to substantially remove retained abrasive materials while forming the alumina thin film.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

The present invention can be more clearly understood from the following detailed description with reference to the drawings, wherein:

FIGS. 1A-1D are scanning electron microscopy photos of Al gate surfaces after being cleaned with deionized water, wherein FIG. 1A is a scanning electron microscope (SEM) photo of a first patterned wafer, FIG. 1B is a SEM photo of a second patterned wafer and FIGS. 1C and 1D are photos of different portions of a blanket wafer.

DESCRIPTION OF THE EMBODIMENTS

Figure 1D:
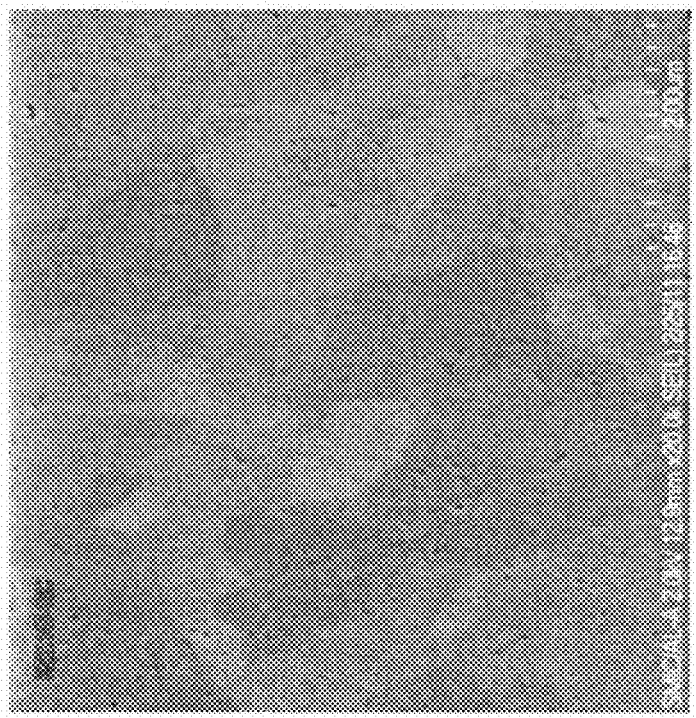
Figure 1C:
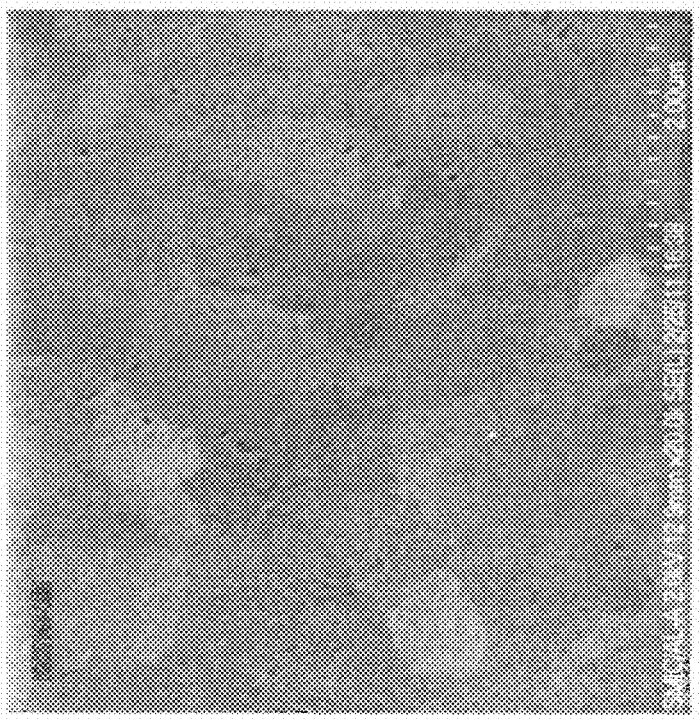

Various exemplary embodiments of the present invention will now be described in detail with reference to the drawings. It should be noted that the relative arrangement of the components and steps, the numerical expressions and values set forth in these embodiments do not limit the scope of the present invention unless it is specifically stated otherwise.

The following description of at least one exemplary embodiment is merely illustrative in nature and is not intended to limit the invention, its application, or uses.

Techniques, methods and devices as known by one skilled in the art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Similar reference numerals and letters refer to similar items in the following figures, and thus once an item is defined in one figure, it is possible that said item will not be further discussed in the following figures.

Figure 2:
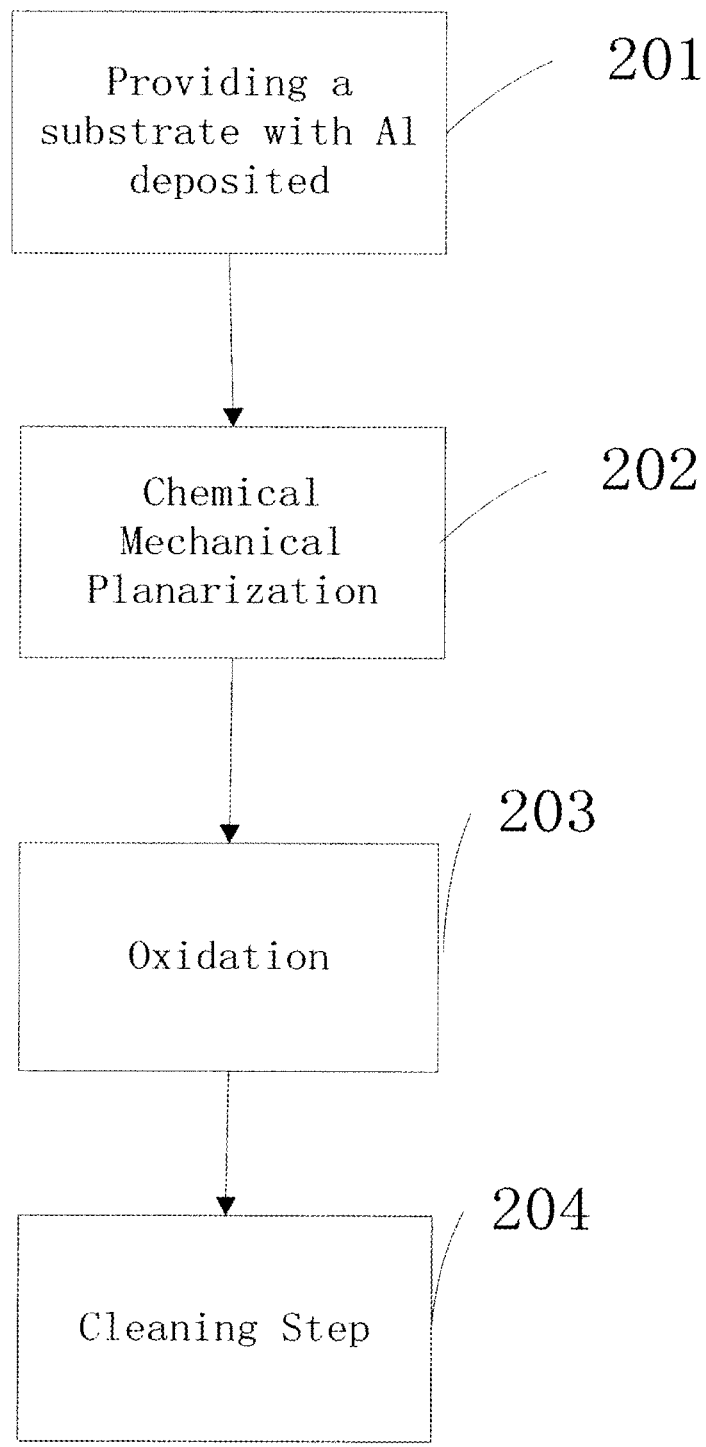
FIG. 2 is a flowchart showing a method of fabricating a semiconductor device according to the present invention.

FIG. 2 is a flowchart showing a method for fabricating a semiconductor device according to the present invention.

First, a substrate on which aluminium is deposited is provided (step 201). Those skilled in the art can select appropriate substrates and the fabricating methods thereof based on specific devices to be fabricated.

Chemical mechanical planarization is then carried out on the substrate on which the aluminium is deposited, so as to expose the surfaces of the Al gates (step 202). Excessive aluminium is removed through chemical mechanical polishing, retaining only those portions to be used as Al gates, so as to form Al gates and expose the surfaces of those Al gates. Further, chemical mechanical polishing can make the substrate surface flatter, facilitating further depositions and other processes. Those skilled in the art can select abrasive materials, specific grinding steps and grinding parameters, which are not critical to the present invention, and hence their detailed description is omitted in specific embodiments below.

Next, the substrate on which Al gates are formed is subjected to an oxidation process with $H_2O_2$ solution (203).

In the oxidation process, in order to protect the surfaces of the Al gates that have just been CMP processed and to prevent the occurrence of corrosion or pits on the surfaces of the Al gates, $H_2O_2$ solution is utilized to oxidize the surfaces of Al gates that have been CMP processed (step 203), so as to form a thin film of alumina ($Al_2O_3$) on the surfaces of the Al gates.

In subsequent processes, even if Al gates are exposed to air, deionized water, cleaning agents or other circumstances, corrosion or pits can be effectively prevented from occurring on the surfaces of Al gates, because the compact $Al_2O_3$ film can isolate the surfaces of Al gates from outside.

Finally, the substrate on which the Al gates are formed is cleaned (step 204) to remove remaining abrasive materials on the surface of the substrate.

Figure 4:
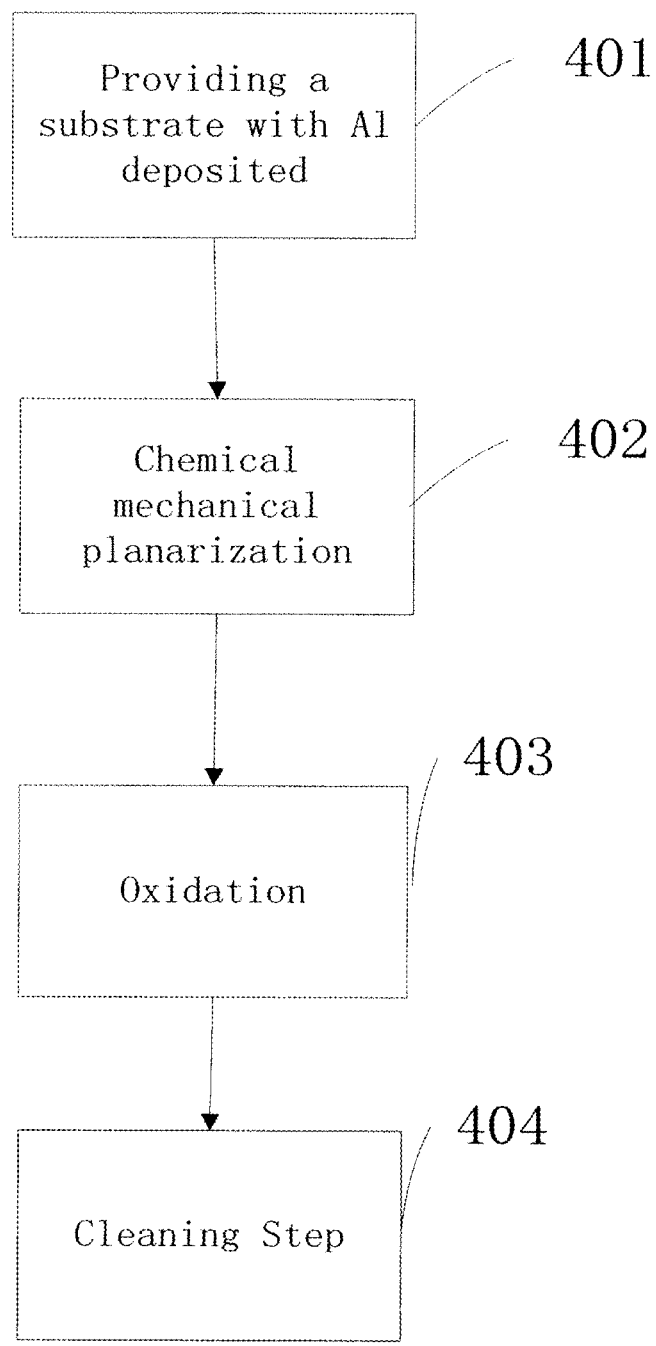
FIG. 4 shows a flowchart of a method of fabricating a semiconductor device according to a first embodiment of the present invention.

FIG. 4 shows a flowchart of the method of fabricating a semiconductor device according to the first embodiment of the present invention.

As shown in FIG. 4, at first, a substrate on which aluminium is deposited is first provided (step 401).

Figure 3A:
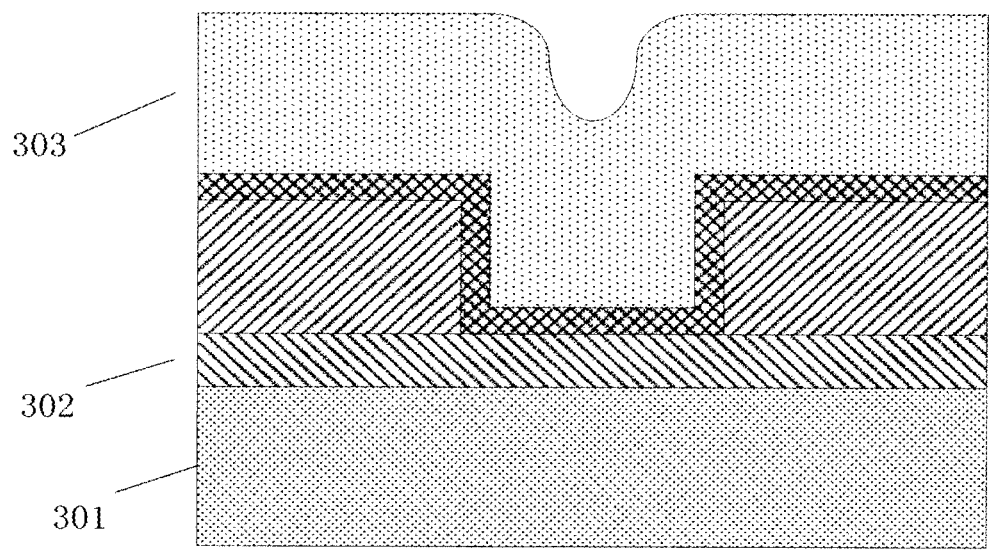
FIG. 3A and FIG. 3B show exemplary structures of a semiconductor device substrate according to the present invention.

FIG. 3A shows an exemplary structure of the substrate of the present embodiment. As shown in FIG. 3A, the substrate is a typical FET device, which, from top to bottom, includes a semiconductor substrate 301, an insulating layer 302, a deposited aluminium layer 303, and the like. Since the substrate structure, which is merely illustrative, is familiar to those skilled in the art, its specific structure is not an emphasis of the present invention, and hence will not be discussed in detail herein.

Chemical mechanical planarization is then carried out on the provided substrate (step 402). Steps 401, 402 are similar to steps 201 and 202 of FIG. 2 respectively, which will not be described again in detail.

Figure 3B:
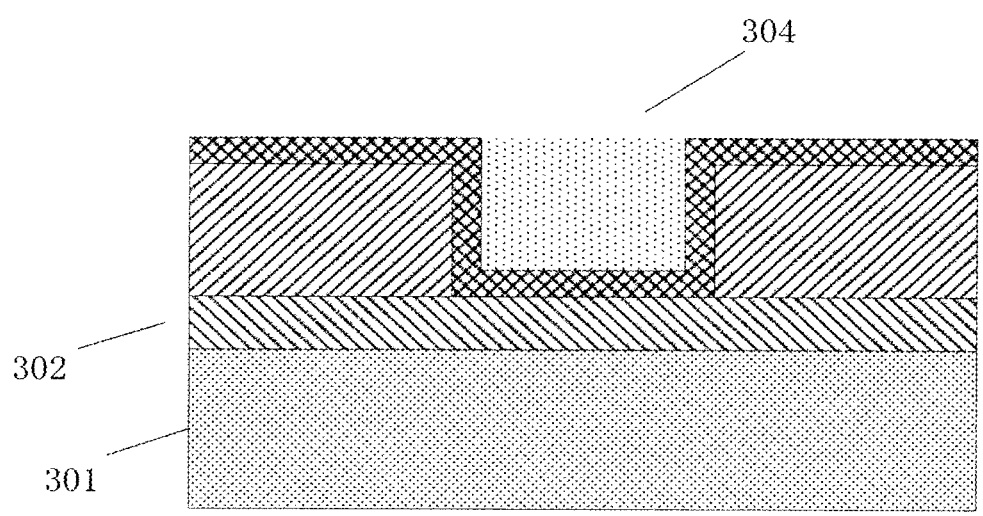

FIG. 3B shows the CMP processed structure of the substrate in FIG. 3A.

It can be seen from FIG. 3B that, after the above CMP process, the surfaces of the Al gates 304 are exposed.

Next, an oxidation process is carried out on the CMP processed substrate (403).

In the oxidation step 403, $H_2O_2$ solution is used to treat the surfaces of the Al gates to protect the surfaces. The mass concentration of the $H_2O_2$ solution is preferably larger than or equal to 4%, and the duration of the oxidation process is preferably less than or equal to 10 s. More preferably, the duration of the oxidation process is larger than 1 s and less than 8 s, and mass concentration of the $H_2O_2$ solution is larger than or equal to 15%. In an embodiment of the present disclosure, the mass concentration of the $H_2O_2$ solution is 4%, and the duration of the oxidation process is 10 s.

Finally, a subsequent cleaning process (Step 404) is carried out on the substrate, the Al gates of which have been subjected to the oxidation process, so as to remove abrasive materials remaining on the surface. Since a compact film of alumina has been formed on the surfaces of the Al gates when carrying out the cleaning process, the surfaces can not be corroded by cleaning agents, such as deionized water. In prior art, the substrates also need to be cleaned after the CMP process to remove remaining abrasive materials, and those skilled in the art can adopt appropriate cleaning agents and manners to clean the substrate, which will not be discussed in detail in the present invention.

Figure 5A:
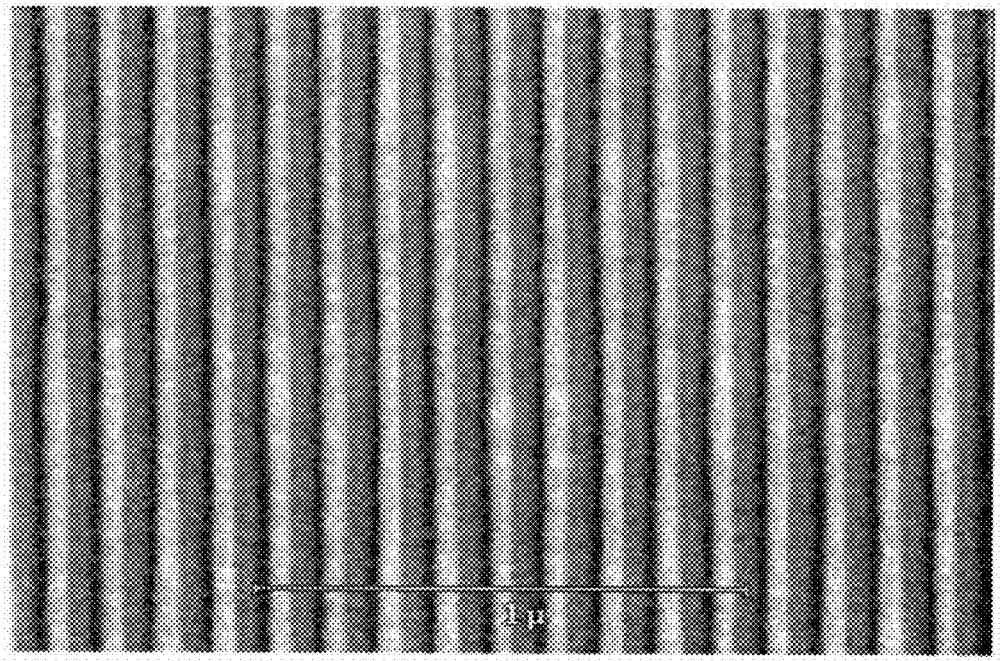
FIGS. 5A and 5B show a scanning electron microscopy photos of a semiconductor device at two different magnifications obtained from the method of fabricating a semiconductor device according to the first embodiment of the present invention.
Figure 5B:
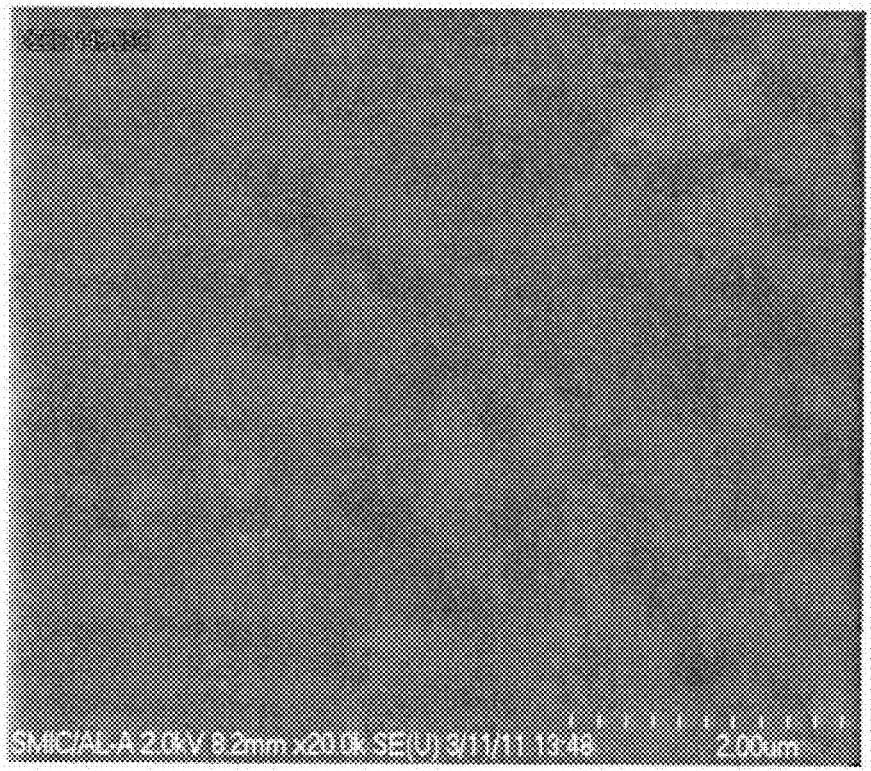

FIGS. 5A and 5B show scanning electron microscopy photos of an Al film obtained after the oxidation process in an embodiment of the present invention. It can be seen from FIGS. 5A and 5B that, after the oxidation process, corrosion and pits on the Al film are reduced.

Figure 6:
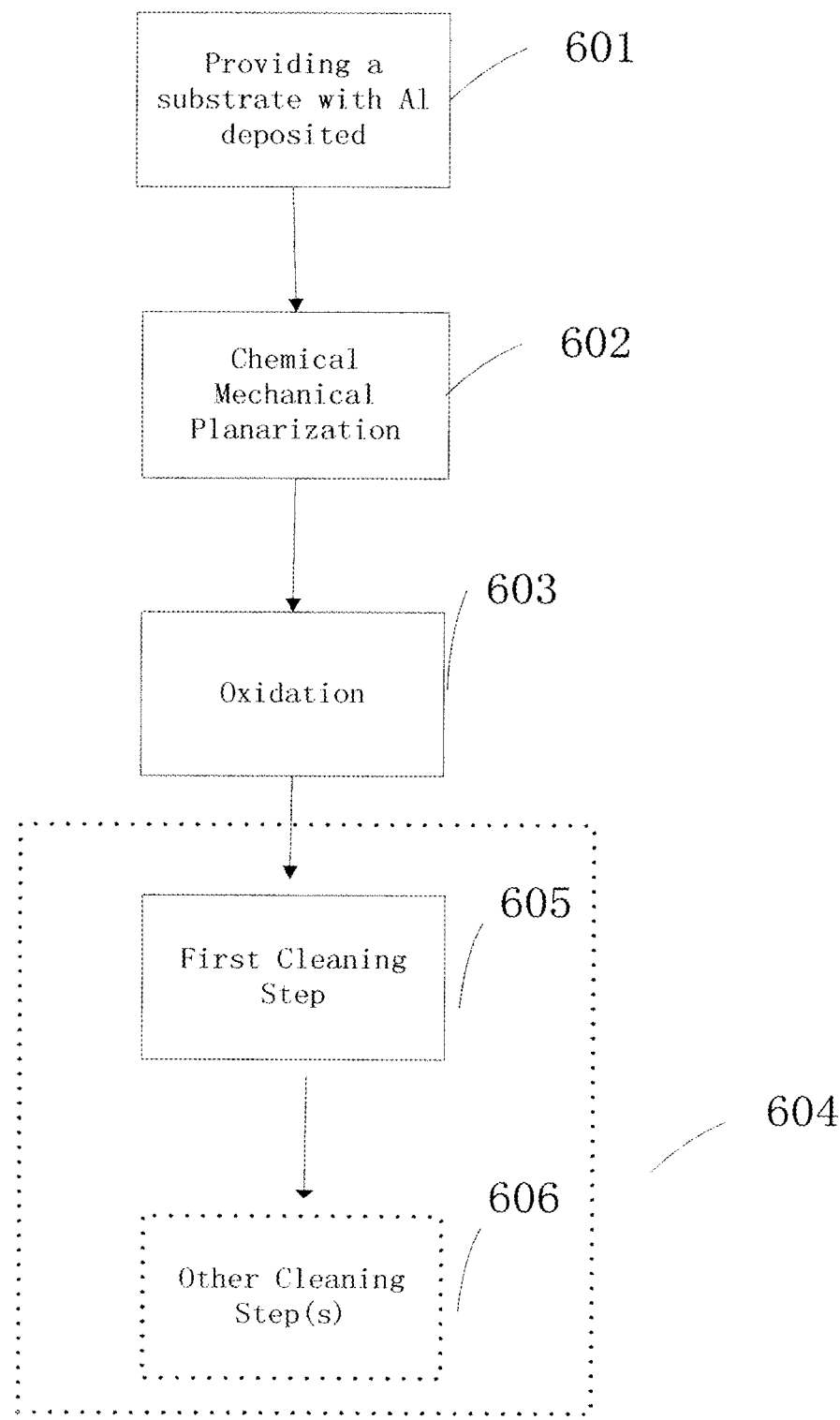
FIG. 6 shows a flowchart of the method for fabricating a semiconductor device according to a second embodiment of the present invention.

FIG. 6 shows a flowchart of the method for fabricating a semiconductor device according to a second embodiment of the present invention.

In this embodiment, as shown in FIG. 6, first, a substrate on which aluminium is deposited is provided (step 601), and then chemical mechanical planarization is carried out on the substrate (step 602). Both steps are similar to steps 401 and 402 of FIG. 4, respectively. Thus, the description of these steps will be omitted herein.

An oxide step (603) and a first cleaning process (605) are then carried out. The oxide step 603 and the first cleaning process 605 are carried out continuously, so that the surface of the substrate can be cleaned at the same time the oxidation is carried out. Other cleaning processes in step 606 are optional, and those skilled in the art can determine whether a further cleaning process is required based on practical situations.

In the oxidation step 603 and the first cleaning step 605, the surface of the substrate which has been subjected to the CMP process is continuously treated with $H_2O_2$ solution so that the aluminium is oxidized to form a compact $Al_2O_3$ film while removing remaining abrasive materials from the substrate. In this embodiment, the mass concentration of the $H_2O_2$ solution is preferably higher than 4%, and the process duration (i.e., the sum of the process time of the oxidation step and the process time of the first cleaning step) is extended to 10 s-50 s. In a more specific example, the mass concentration of the $H_2O_2$ solution is 10%, and the process duration is 35 s.

After the above-mentioned oxidation step 603 and the first cleaning steps 605, the substrate is substantially free of the abrasive materials. As an optional step, the substrate may undergo a further cleaning process (606), so that the surface of the substrate can be cleaned to a greater extent. Since a compact $Al_2O_3$ film is formed when the further cleaning step is carried out, corrosion due to cleaning agents such as deionized water is prevented.

In most chemical mechanical planarization devices, the CMP process is usually integrated with the cleaning process, which is called a dry-in/dry-out process. Such procedure can shorten the time required for the grinding and cleaning processes and consequently improve productivity. Therefore, the above steps 602, 603, 604 can be accomplished in a single CMP device.

A CMP device usually comprises a grinding head, a rotating platen, a polishing pad, etc. The substrate to be ground is mounted into the grinding head, the polishing pad is positioned on and driven by the platen to rotate with respect to the grinding head. Abrasive materials are provided between the grinding head and the polishing pad while a down force is appropriately applied to grind the substrate. In such integrated CMP device, the down force is also preferably applied and the rotation of the platen is maintained during the oxidation process (step 603) and the cleaning process (604). In a preferred embodiment, the down force of the grinding head is less than or equal to 0.8 psi. In another preferred embodiment, the rotating speed of the platen is 50 rpm to 110 rpm. Of course, those skilled in the art will appreciate that these two preferred embodiments can be combined together in a more preferred embodiment, namely, the down force of the grinding head is less than or equal to 0.8 psi and the rotating speed of the platen is 50 rpm to 110 rpm. As such, the substrate cleaning and oxidization is improved.

The present invention has been described in detail with reference to the drawings. Those skilled in the art may appreciate that the method of the present invention can be realized in various manners. The above order of the steps of the method is merely illustrative, and those steps are not limited to the order described specifically, unless it is specifically stated otherwise.

Although some specific embodiments of this invention have been illustrated in detail by way of examples, those skilled in the art will appreciate that the above examples are merely illustrative and are not intended to limit the scope of this invention. It should be understood by a person skilled in the art that the above embodiments can be modified without departing from the scope and spirit of the present invention. The scope of the present invention is defined by the attached claims.

What is claimed is:

1. A method of fabricating a semiconductor device, comprising:
   a step of providing a substrate with aluminium deposited thereon;
   a chemical mechanical planarization (CMP) step, for carrying out a CMP process on the substrate, so as to form a plurality of Al gates and expose a surface of each Al gate;
   an oxidation step, for oxidizing the surface of each Al gate that has been subjected to the CMP process comprising treating with an $H_2O_2$ solution, so as to form a film of $Al_2O_3$ on the surface of each Al gate to prevent the Al gates from eroding; and
   a substrate cleaning step consisting of cleaning the substrate with only the $H_2O_2$ solution,
   wherein the $H_2O_2$ solution consists of water and hydrogen peroxide.

2. The method according to claim 1, wherein the CMP step, the oxidation step and the cleaning step are carried out in a chemical mechanical planarization device which comprises a grinding head for positioning the semiconductor device, a down force applied by the grinding head being less than 0.8 psi in the oxidation and the cleaning steps.

3. The method according to claim 1, wherein the CMP step, the oxidation step and the cleaning step are carried out in a chemical mechanical planarization device which comprises a grinding head for positioning the semiconductor device, a down force applied by the grinding head being less than 0.8 psi in the oxidation and the cleaning steps.

4. The method according to claim 1, wherein the oxidation step is carried out in a chemical mechanical planarization device comprising a rotating platen provided with a polishing pad, wherein the rotating speed of the rotating platen is 50 rpm to 110 rpm in the oxidation and the cleaning steps.

5. The method according to claim 1, wherein the oxidation step is carried out in a chemical mechanical planarization device comprising a rotating platen provided with a polishing pad, wherein the rotating speed of the rotating platen is 50 rpm to 110 rpm in the oxidation and the cleaning steps.

6. The method according to claim 1, wherein the process duration of the oxidation step is less than 10 s.

7. The method according to claim 1, wherein the process duration of the oxidation step is less than 10 s.

8. The method according to claim 6, wherein the mass concentration of the $H_2O_2$ solution is larger than or equal to 15%.

9. The method according to claim 7, wherein the mass concentration of the $H_2O_2$ solution is larger than or equal to 15%.

10. The method according to claim 1, wherein the sum of process duration of the oxidation step and the process duration of the cleaning step is 10 to 50 seconds.

11. The method according to claim 10, wherein the mass concentration of the $H_2O_2$ solution is larger than or equal to 4%.

* * * * *